United States Patent
Aizawa et al.

(10) Patent No.: US 10,734,278 B2
(45) Date of Patent: Aug. 4, 2020

(54) METHOD OF PROTECTING LOW-K LAYERS

(71) Applicant: Tokyo Electron Limited, Tokyo (JP)

(72) Inventors: Hirokazu Aizawa, Albany, NY (US); Karthikeyan Pillai, Albany, NY (US); Nicholas Joy, Albany, NY (US); Kandabara Tapily, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/436,687

(22) Filed: Jun. 10, 2019

(65) Prior Publication Data

US 2019/0385906 A1 Dec. 19, 2019

Related U.S. Application Data

(60) Provisional application No. 62/696,697, filed on Jul. 11, 2018, provisional application No. 62/685,372, filed on Jun. 15, 2018.

(51) Int. Cl.
*H01L 21/768* (2006.01)
*H01L 21/3213* (2006.01)

(52) U.S. Cl.
CPC .. *H01L 21/76832* (2013.01); *H01L 21/32136* (2013.01); *H01L 21/32139* (2013.01)

(58) Field of Classification Search
CPC .......... H01L 21/3105; H01L 21/76814; H01L 21/76808; H01L 21/02126; H01L 21/76831; H01L 21/31144; H01L 21/31116; H01L 21/67069; H01L 21/31138; H01L 23/5329
See application file for complete search history.

(56) References Cited

U.S. PATENT DOCUMENTS

| | | | |
|---|---|---|---|
| 9,368,395 B1* | 6/2016 | Wei | H01L 21/76805 |
| 2006/0264033 A1* | 11/2006 | Olmen | H01L 21/76808 438/637 |
| 2007/0037385 A1* | 2/2007 | Huebinger | H01L 21/02063 438/638 |
| 2007/0249179 A1 | 10/2007 | Lin et al. | |
| 2013/0105996 A1* | 5/2013 | Brink | H01L 21/76802 257/786 |
| 2013/0109187 A1* | 5/2013 | Nemani | H01L 21/76814 438/710 |
| 2013/0113068 A1* | 5/2013 | Ramachandran | H01L 21/76898 257/506 |
| 2017/0004999 A1 | 1/2017 | Bouche et al. | |
| 2017/0178955 A1* | 6/2017 | Jiang | H01L 21/31138 |

* cited by examiner

*Primary Examiner* — Jaehwan Oh
(74) *Attorney, Agent, or Firm* — Rothwell, Figg, Ernst & Manbeck, P.C.

(57) ABSTRACT

A process is provided in which low-k layers are protected from etch damage by the use of a selectively formed protection layer which forms on the low-k layer. In one embodiment, the low-k layers may be low-k dielectric layers utilized in BEOL process steps. In one embodiment, the selectively formed protection layer may be formed by a selective deposition process which selectively forms layers on the low-k dielectric but not over the conductor layer. The selectively formed protection layer may then be utilized to protect the low-k layer from a plasma etch that is utilized to recess the conductor. In this manner, a conductor (for example metal) may be recessed in a low-k dielectric layer via a plasma etch process.

20 Claims, 12 Drawing Sheets

METHOD OF PROTECTING LOW-K LAYERS

This application claims priority to U.S. Provisional Patent Application No. 62/685,372, entitled "Method of Protecting Low K Layers," filed Jun. 15, 2018 and U.S. Provisional Patent Application No. 62/696,697, entitled "Method of Protecting Low K Layers," filed Jul. 11, 2018; the disclosures of which are expressly incorporated herein, in their entirety, by reference.

BACKGROUND

The present disclosure relates to the processing of substrates. In particular, it provides methods utilized to suppress damage to process layers.

As critical dimensions of features formed on substrates continue to shrink, the use of low dielectric constant (Low-k) materials (materials having a dielectric constant that is smaller than silicon dioxide) in substrate processing has become more important. Low-k materials may be used to form low-k layers that are utilized in a wide variety of points of a substrate process flow, including front end of line (FEOL) and back end of line (BEOL) process steps. For example, it has been found that the lower dielectric constant of low-k dielectric layers improves electrical characteristics (for example capacitance characteristics) which improve device performance when a BEOL conductor line is embedded within a dielectric layer.

The shrinking of critical dimensions has also placed increased demands upon the alignment and overlay of the various patterned layers of a substrate with respect to each other. To address such needs at BEOL conductor and via layers, fully self-aligned via (FSAV) processes have been proposed for the connection of an upper and lower conductor layer (typically metal layers) through a via. Various techniques have been utilized to form a FSAV. In many embodiments, a FSAV may utilize a process in which a recess is formed in the lower conductor layer. The formation of a conductor recess is typically accomplished through the use of a wet etch or dry plasma etch. A dry plasma etch may be preferred for costs benefits.

It has been found, however, that when a FSAV process is utilized with low-k dielectrics, the use of a plasma etch to provide the conductor recess may damage the low-k dielectric layer. For example, the plasma etch may damage the low-k dielectric material by increasing the dielectric constant at the surface of the low-k dielectric layer, thus hindering the benefit of using a low-k material. FIGS. 1A-1C illustrate the impact of the use of a plasma etch to form a metal recess in a low-k dielectric layer. As shown in FIG. 1, a structure 100 is provided on a substrate 105. A low-k layer 115 (for example a low-k dielectric layer) is provided along with an underlying layer 110. Conductor layer 120 may be formed as shown. A barrier or liner layer 125 may be provided under the conductor layer 120 between the conductor layer 120 and the low-k layer 115.

The structure 100 may then be exposed to a plasma 130 as shown in FIG. 1B in order to provide recesses in the conductor layer 120 as part of the FSAV process. The plasma etch recess process may lead to a damaged low-k layer 135 at the surface of the low-k dielectric layer as shown in FIG. 1C. The dielectric constant of the damaged low-k layer 135 may be increased due to damage caused by the recess plasma etch. The damaged low-k layer 135 may thus have a higher dielectric constant than undamaged portions of the low-k layer 115. The regions of a higher dielectric constant may negate some of the benefits of utilizing the low-k material, for example impacting electrical device characteristics.

Thus, it would be desirable to utilize a process flow in which low-k layers are not damaged due to conductor recess etching process steps.

SUMMARY

In one embodiment, a process is provided in which low-k layers are protected from etch damage by the use of a selectively formed protection layer which forms on the low-k layer. In one embodiment, the low-k layers may be low-k dielectric layers utilized in BEOL process steps. In one embodiment, the selectively formed protection layer may be formed by a selective deposition process which selectively forms layers on the low-k dielectric but not over the conductor layer. The selectively formed protection layer may then be utilized to protect the low-k layer from a plasma etch that is utilized to recess the conductor. In this manner, a conductor (for example metal) may be recessed in a low-k dielectric layer via a plasma etch process.

In another embodiment, a method for processing a substrate is disclosed. The method comprises providing the substrate with a patterned structure comprising a conductor layer and a low-k layer. The method further comprises forming a self-aligned monolayer on exposed surfaces of the conductor layer and performing a selective deposition of a protection layer, the selective deposition selectively forming a protection layer on the low-k layer. The method further comprises performing a conductor recess dry etch to selectively removing the self-aligned monolayer and a portion of the conductor layer, wherein the protection layer suppresses damage to the low-k layer during the conductor recess dry etch.

In another embodiment, a method utilized in forming a self-aligned via is disclosed. The method comprises providing a substrate with a patterned structure comprising a conductor layer and a low-k dielectric layer, the conductor layer being embedded in the low-k dielectric layer, and the conductor layer being a lower conductor layer to which the self-aligned via will be located over. The method also comprises performing a selective formation of a protection layer, the selective formation selectively forming the protection layer over the low-k dielectric layer and not over the conductor layer. The method further comprises performing a conductor recess dry etch to selectively removing a portion of the conductor layer, wherein the protection layer suppresses damage to the low-k layer during the conductor recess dry etch.

In another embodiment, a method utilized in forming a recess in a metal layer is disclosed. The method comprises providing a substrate with a patterned structure comprising a metal layer and a low-k dielectric layer, the metal layer being embedded in the low-k dielectric layer, the metal layer having a plurality of exposed metal surfaces and the low-k dielectric layer having a plurality of low-k dielectric exposed surfaces. The method also comprises performing a selective formation of a protection layer, the selective formation selectively forming the protection layer over the plurality of low-k dielectric exposed surfaces. The method further comprises performing a metal recess dry etch to removing a portion of the metal layer, thereby forming a recess in the metal layer, wherein the protection layer suppresses damage to the low-k dielectric layer during the metal recess dry etch.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

A process is provided in which low-k layers are protected from etch damage by the use of a selectively formed protection layer which forms on the low-k layer. In one embodiment, the low-k layers may be low-k dielectric layers utilized in BEOL process steps. In one embodiment, the selectively formed protection layer may be formed by a selective deposition process which selectively forms layers on the low-k dielectric but not over the conductor layer. The selectively formed protection layer may then be utilized to protect the low-k layer from a plasma etch that is utilized to recess the conductor. In this manner, a conductor (for example metal) may be recessed in a low-k dielectric layer via a plasma etch process.

Figure 1A:
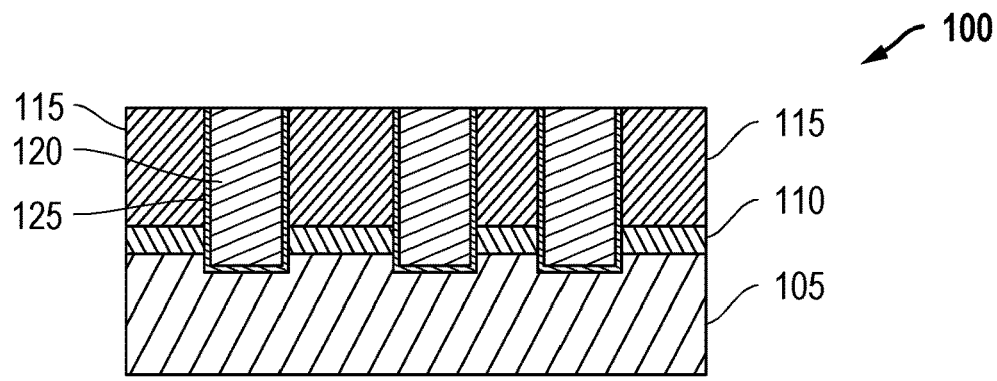
FIGS. 1A-1C illustrate a prior art process for recessing a conductor layer in which the low-k dielectric layer is damaged.
Figure 1B:
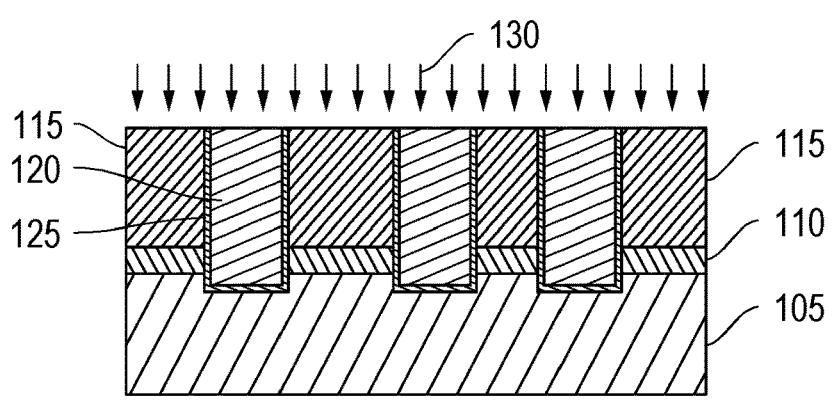
Figure 1C:
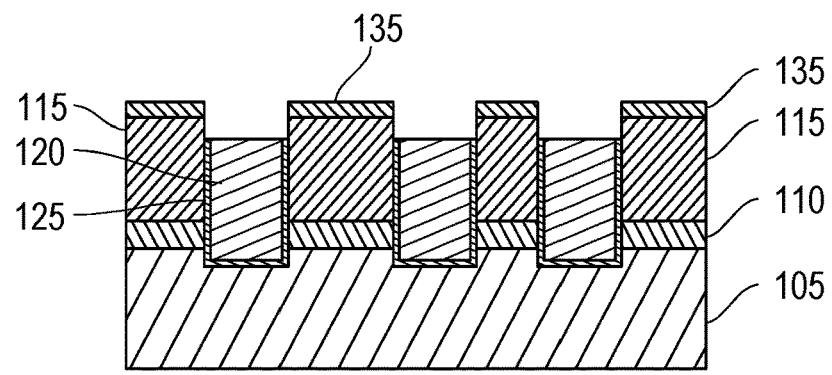
Figure 2A:
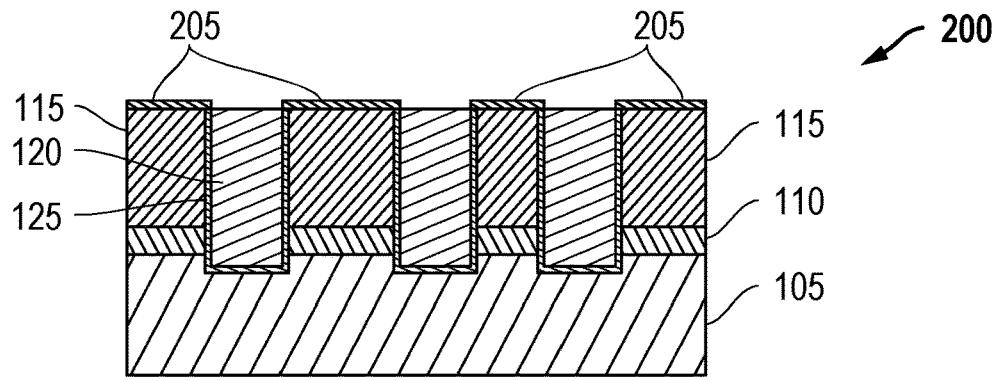
FIGS. 2A-2C illustrate an exemplary process for recessing a conductor layer without damaging a low-k layer.
Figure 2B:
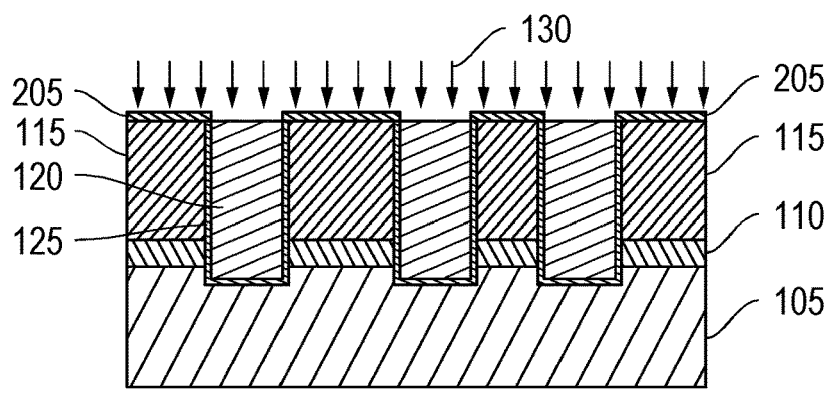
Figure 2C:
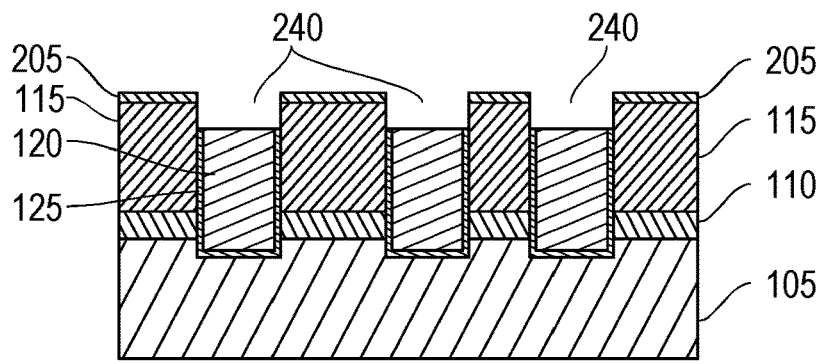

FIGS. 2A-2C illustrate an exemplary embodiment of the techniques disclosed herein in which a protection layer is selectively formed on a low-k dielectric layer. More specifically, as shown in FIG. 2A, a structure 200 may be similar to the structure 100 of FIG. 1A except for the inclusion of protection layer 205. In exemplary embodiments, the low-k layer 115 may be SiOCH. However, it will be recognized that various types of low-k layers may be utilized, including but not limited to, doped silicon dioxides (fluorine, carbon and other dopants), spin-on polymers (including organic and silicon based polymers), porous oxides, etc., all being well-known in the art. In one exemplary embodiment, conductor layer 120 may comprise ruthenium (Ru). Other exemplary conductive materials include, but are not limited to, copper, cobalt and tungsten. In one exemplary embodiment, underlying layer 110 may comprise, but is not limited to, silicon carbon nitride (SiCN). Other exemplary materials for underlying layer 110 include but are not limited to silicon carbide (SiC), aluminum oxides (AlOx), aluminum nitride (AlN) and oxide doped carbon (ODC). All of such layers are merely exemplary, however, as the techniques described herein are not limited to particular materials. It will be recognized that the techniques disclosed herein may be utilized with more or less layers than those shown in FIG. 2A as structure 200 is intended to be an exemplary structure. Thus, the techniques described herein may be utilized with many other substrate structures and process flows.

The protection layer 205 may be selectively provided on the upper exposed surfaces of the low-k layer 115 as shown in FIG. 2A. The protection layer 205 operates to protect the low-k layer 115 during any conductive layer recess etch steps. In one embodiment, the protection layer 205 may comprise a silicon oxide ($SiO_2$) layer. Other materials, however, may be utilized for the protection layer 205 as described below. As shown in FIG. 2A, protection layer 205 is formed as a thin film upon surfaces of the low-k layer 115 but is not deposited upon the surfaces of the conductor layer 120. Then, as shown in FIG. 2B, the structure 200 may be exposed to a plasma 130. The plasma 130 selectively dry etches the exposed portions of the conductor layer 120 so as to create recesses 240 as shown in FIG. 2C. In one embodiment, the dry plasma etch utilized to form the recesses 240 is a dry plasma etch containing oxygen. Thus, in one embodiment, an oxygen based plasma etch which etches exposed ruthenium surfaces is utilized. Other chemistries may be utilized to form the recesses 240, including but not limited to, fluorine-based chemistries. The presence of the protection layer 205 protects the low-k layer 115 from damage that may be caused due to exposure to the plasma 130.

The structure 200 of FIGS. 2A-2C may be part of any substrate for which the use of a patterned feature is desirable. For example, in one embodiment, the substrate may be a semiconductor substrate having one or more semiconductor processing layers formed thereon. In another embodiment, the semiconductor substrate is a semiconductor wafer. In yet another embodiment, the substrate may have been subject to multiple semiconductor processing steps which yield a wide variety of structures and layers, all of which are known in the substrate processing art. Thus, it will be recognized that the substrate may include many additional layers and structures not shown in FIGS. 2A-2C. In one exemplary embodiment, the structure may be used as part of a BEOL processing step for processing a semiconductor wafer. In a more specific embodiment, the recesses 240 may be provided in preparation of a subsequent FSAV process (not shown) utilized to provide a via to the conductor layer 120.

The final structure of FIG. 2C may then be utilized as part of a FSAV process which advantageously utilizes the recessed metal structure shown in the figure. Thus, though not shown in the figures, an additional dielectric layer (s) may then be provided over the conductor layer 120 and the low-k layer 115 through which a via may be formed for connecting an upper conductor (not shown) to the lower conductor (the conductor layer 120 of FIGS. 2A-2C). It will be recognized that the conductor recess process described herein may be utilized, however, for other substrate processing steps and is not limited to a use in a FSAV process. Thus, the techniques described herein may be advantageously implemented in other processes where it is desired to protect a layer from plasma or other damage.

Figure 3A:
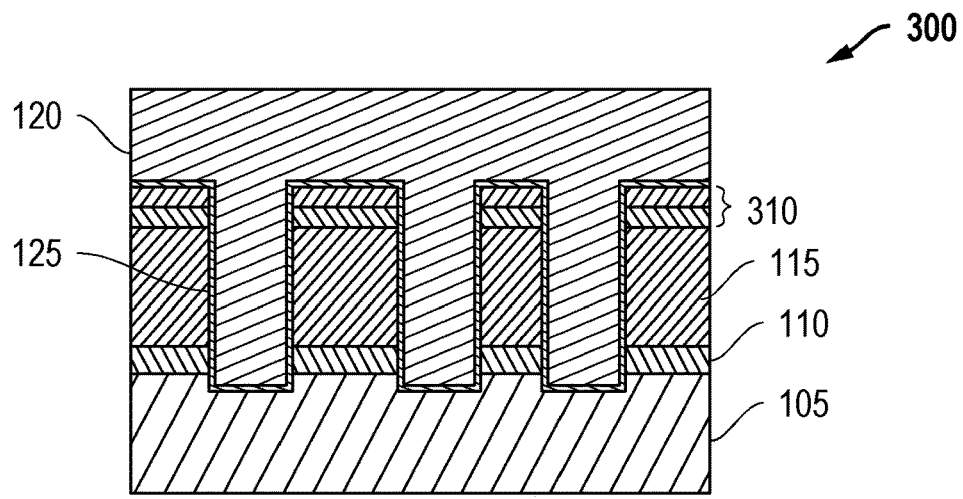
FIGS. 3A-3F illustrate another exemplary process for recessing a conductor layer without damaging a low-k layer.

Another exemplary process utilizing the techniques described herein is shown in FIGS. 3A-3F. As shown in FIG. 3A, a structure 300 is similar in some respects to the structure 200 of FIG. 2A in that a substrate 105, underlying layer 110 and low-k layer 115 are provided. As shown in FIG. 3A, a hard mask layer 310 may be provided on the low-k layer 115. The hard mask layer 310 may be comprised of one or more layers and may include, for example, silicon oxide ($SiO_2$), silicon oxynitride (SiON), silicon nitride (SiN), and titanium nitride (TiN) layers. The structure 300 is shown at the process point in which conductor layer 120 has been deposited over the substrate 105. A barrier or liner layer 125 is also provided as shown. As shown in FIG. 3A, the conductor layer 120 is provided over the substrate 105 and fills patterned voids of the low-k layer 115.

Figure 3B:
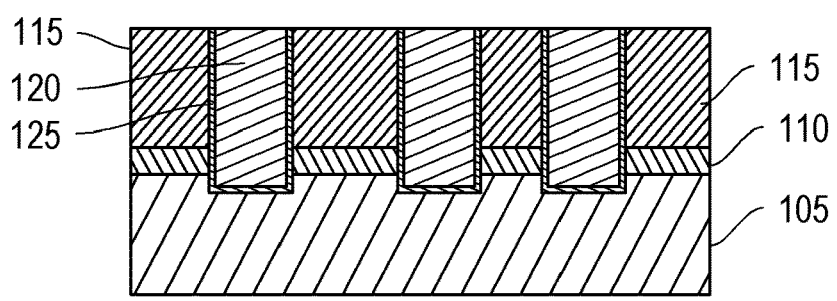
Figure 3C:
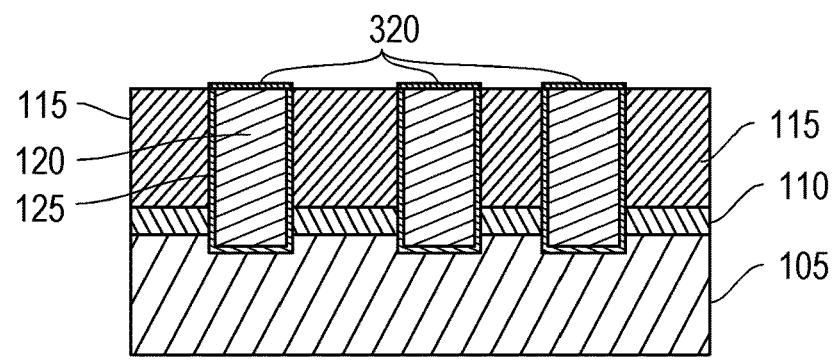

Next, as shown in FIG. 3B, a conductor etch back and/or a chemical mechanical planarization step may be performed to planarize or etch back the conductor layer 120 back to the upper regions of the low-k layer 115. Next a self-assembled monolayer (SAM) may be provided as SAM layer 320 on the substrate. More specifically, as shown in FIG. 3C, the SAM layer 320 will selectively deposit on the surfaces of the conductor layer 120 and not on the low-k layer 115 surfaces. In one embodiment, the SAM process may be formed via a chemical vapor deposition (CVD) process or a spin coating process. The SAM may be defined by a head group plus tail group. The head group defines how the SAM reacts to a specific surface and the tail predicts what kind of blocking or functionalization at the surface. To react to oxide surface silane groups are desired. To react to metal surface usually thiol groups are desired. Thiols are sulfur containing molecule in the head group. Examples of thiols are octadecylthiols and perfluorodecylthiols. In one embodiment, the SAM layer 320 may comprise octadecylthiols and perfluorodecylthiols. However, other SAM materials may be utilized. Thus, it will be recognized, that the techniques described herein are not limited to a particular SAM process, and moreover, not even limited to SAM processes in general.

Figure 3D:
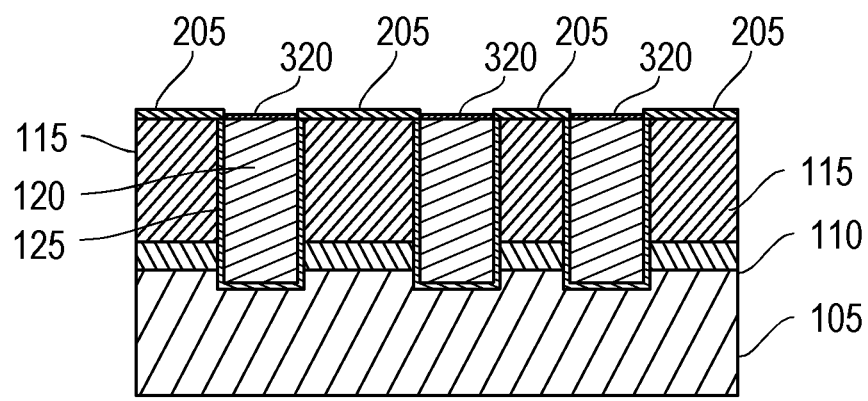
Figure 3E:
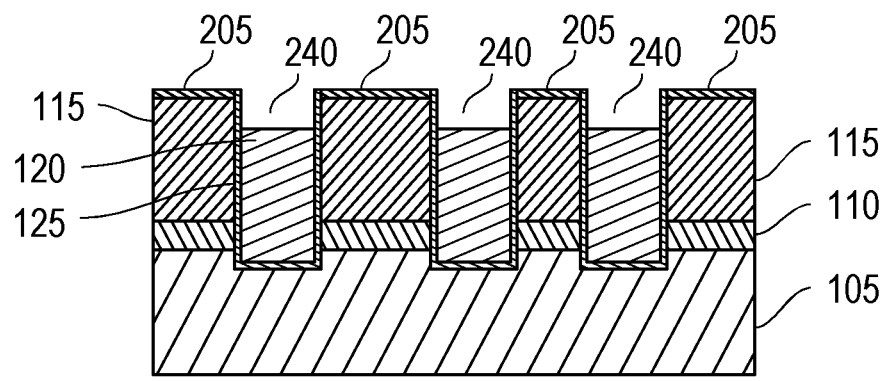

Then, benefiting from the presence of the SAM layer 320 (which is over the metal layer), the protection layer 205 may be selectively formed over the low-k layer 115 surface areas and not on the SAM layer 320 surfaces as shown in FIG. 3D. In one exemplary selective deposition process, source chemical absorption is different between the surface materials. The SAM layer 320 surface has no or less absorption compared to the low-k layer 115 surface. Next, a plasma dry etch such as described above may be utilized to recess the conductor layer 120 to form the recesses 240 as shown in the FIG. 3E. It will be noted that the plasma dry etch etches both the SAM layer 320 and the conductor layer 120 selective to the protection layer 205. In this manner, the low-k layer 115 is protected from damage which may be caused by the plasma etch. Further, the presence of the barrier or liner layer 125 may protect the sidewalls of the low-k layer 115 from being damaged. Thus, in one embodiment, the plasma etch is also selective to the barrier or liner layer 125 so that the barrier or liner layer 125 is not removed as shown in FIG. 3E. Thus, in one embodiment, a conductor recess dry etch selectively etches the conductor layer to the barrier or liner layer so that the barrier or liner layer suppresses damage to sidewalls of the low-k layer during the conductor recess dry etch However, benefits of the techniques disclosed herein may be obtained with use of such an embodiment.

Figure 3F:
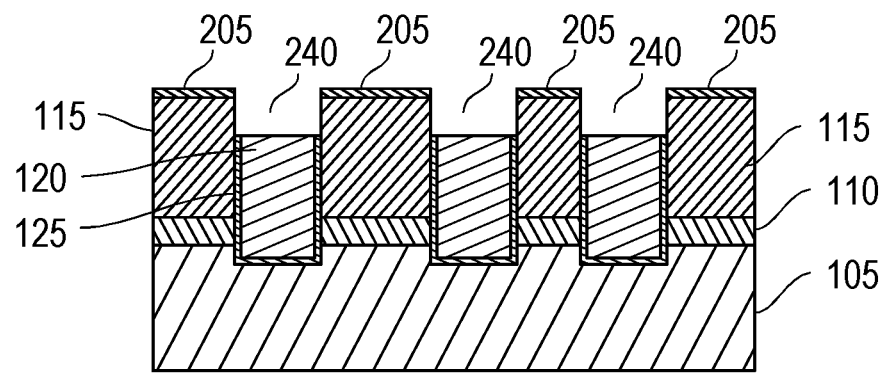

Next, as seen in FIG. 3F, the exposed portions of the barrier or liner layer 125 may then be removed by the use of an etch which etches the barrier or liner layer 125 selective to the other exposed layers. The barrier or liner etch may be a wet etch or a plasma etch. Exemplary barrier or liner etches may include, but are not limited to, a standard clean 1 (SC1) wet etch (for example an alkaline peroxide solution).

Figure 4:
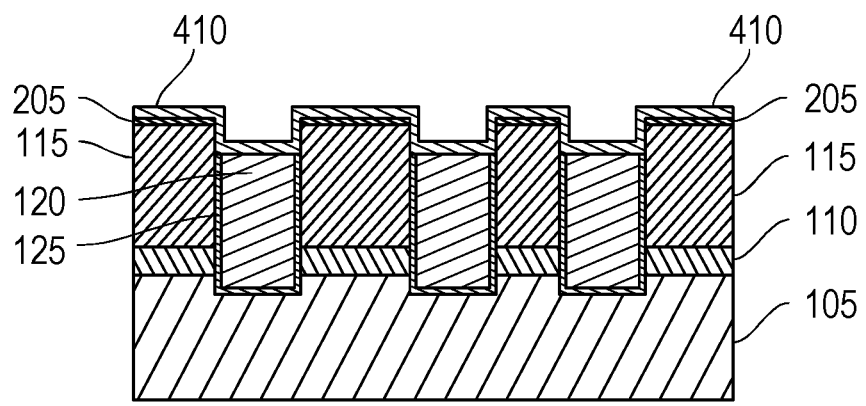
FIG. 4 illustrates an exemplary formation of an etch stop layer after the processing of FIG. 3F.
Figure 5A:
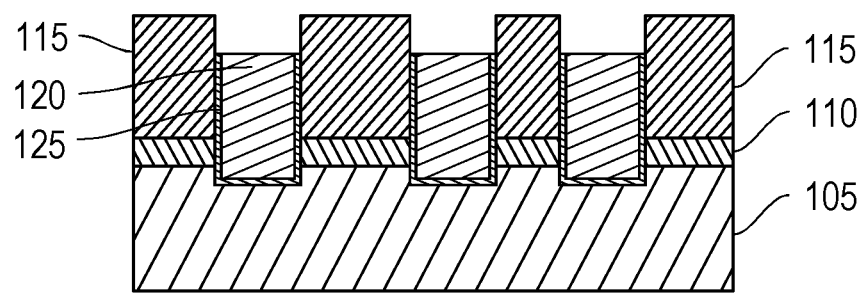
FIGS. 5A-5B illustrates another exemplary formation of an etch stop layer after the processing of FIG. 3F.
Figure 5B:
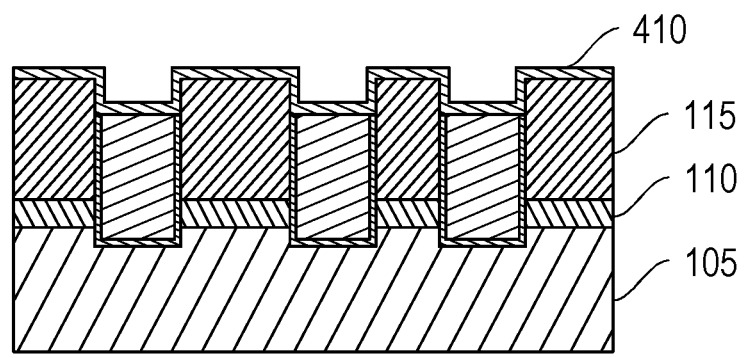

Processing may then proceed according to the particular process flow that the recess techniques are part of. For example, in one exemplary FSAV process flow, an etch stop layer may be formed after the conductor recess is formed. FIGS. 4 and 5A-5B illustrate two exemplary process flows for forming such an etch stop layer. It will be recognized, however, that the particular layers and order of processing may be dependent upon the particular FSAV process utilized. Thus, the examples described herein are not meant to be limiting.

FIG. 4 illustrates one FSAV process step that may occur after the process step shown in FIG. 3F. As shown in FIG. 4, an etch stop layer 410 is formed over the substrate. It is noted that in the process of FIG. 4, the protection layer 205 that is selectively formed is left on the substrate. Then, additional FSAV process steps may be performed as known in the art to complete the formation of additional dielectric layers and a self-aligned via formed to connect to the conductor layer 120.

FIGS. 5A and 5B illustrate alternative steps that may occur after the process step shown in FIG. 3F. More specifically, rather than leaving the protection layer 205 on the substrate, the protection layer 205 may be removed before the formation of an etch stop layer. Thus, for example, after processing of the structure shown in FIG. 3F, the protection layer 205 may be removed as shown in FIG. 5A. Then, as shown in FIG. 5B, the etch stop layer 410 may be formed over the substrate. The removal process utilized to remove the protection layer 205 may be either a wet etch process or a dry etch process. In one exemplary embodiment, a dilute hydrogen fluoride (DHF) etch is utilized. If removed, the material chosen for the protection layer and the etch utilized for removal of the protection layer may be selected so as to lessen the impact of the removal process on the low-k layer.

Thus, as shown in FIGS. 4-5B, processing may proceed by (1) leaving the protection layer on the substrate during one or more additional process steps performed after the recess is formed or (2) processing may proceed, after the recess is formed, by removing the protection layer from the substrate before one or more additional process steps are performed.

Figure 6A:
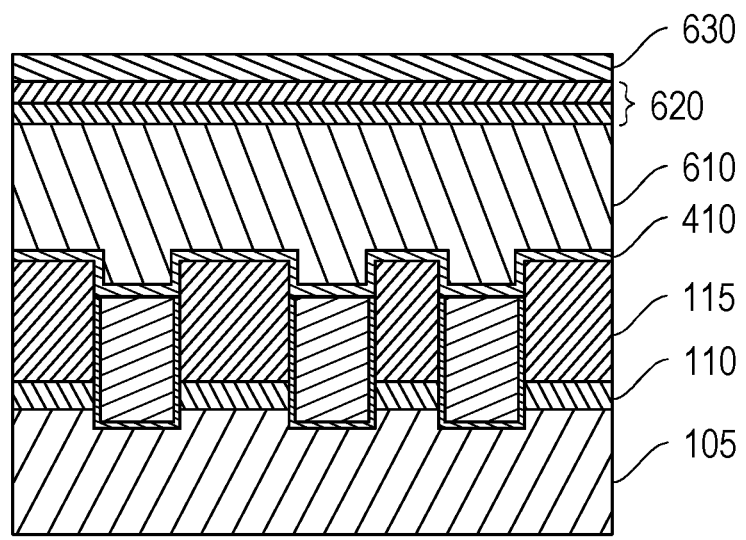
FIGS. 6A-6G illustrate exemplary additional processing after the process steps of FIG. 5B for the formation of a self-aligned via.
Figure 6B:
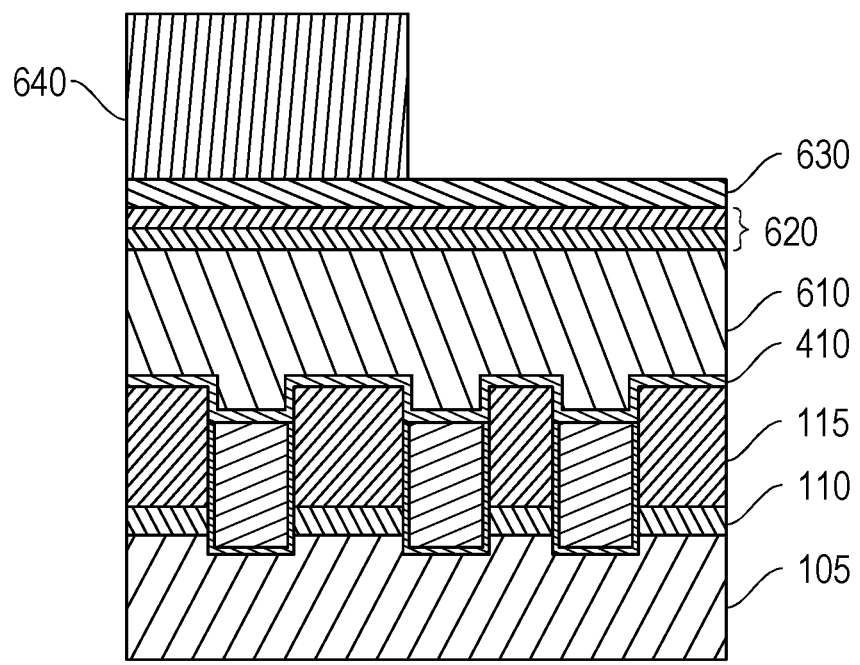
Figure 6C:
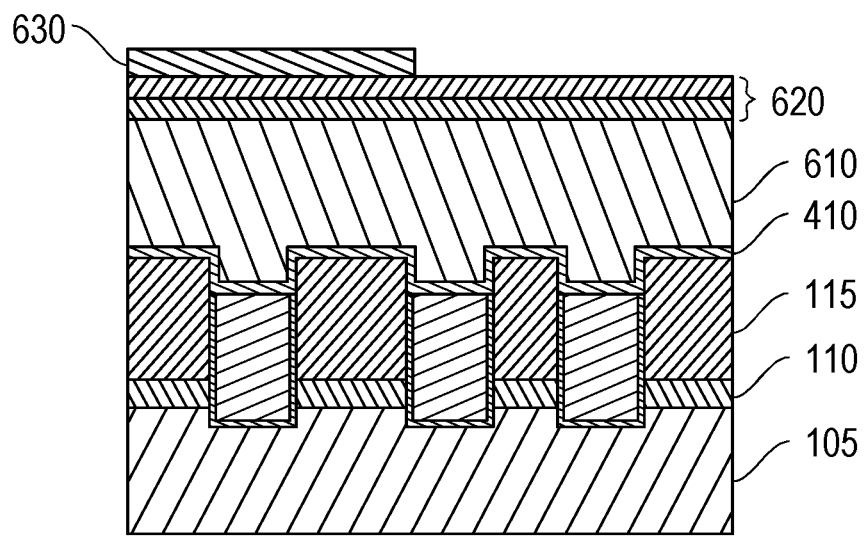
Figure 6D:
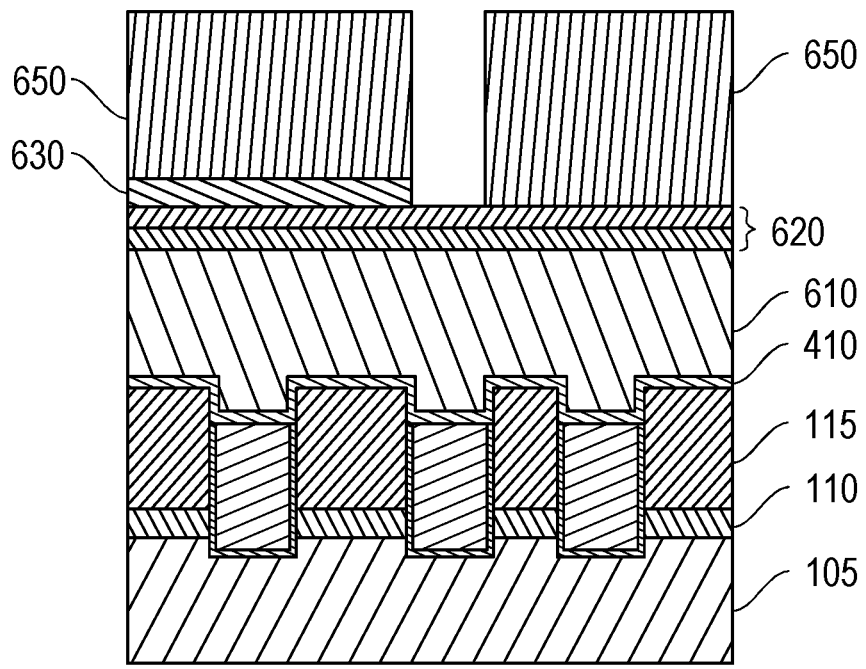
Figure 6E:
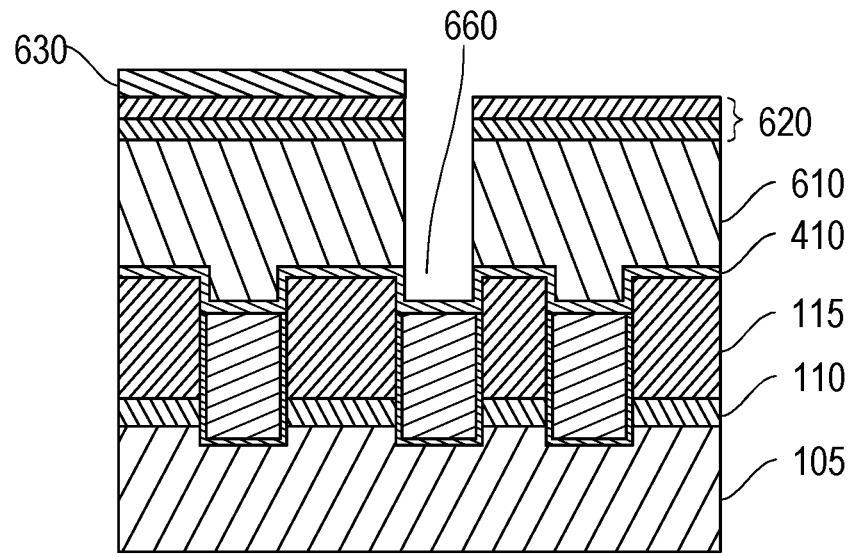
Figure 6F:
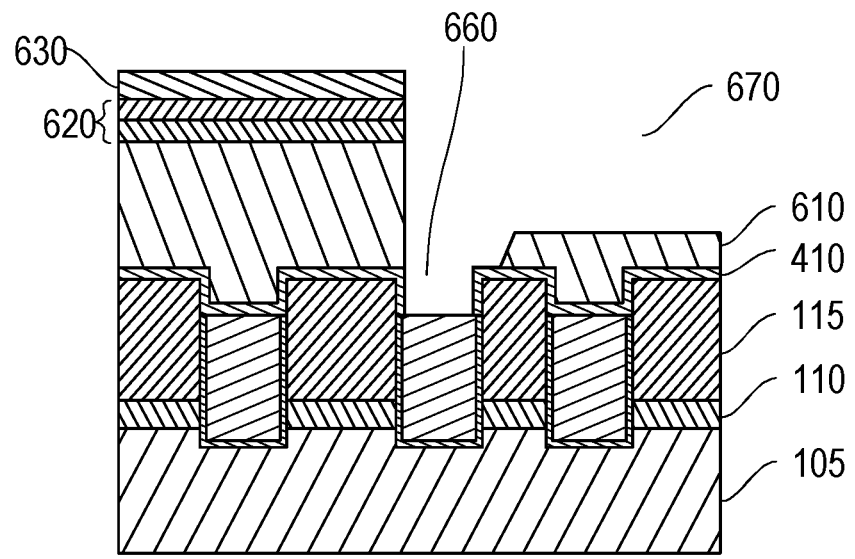
Figure 6G:
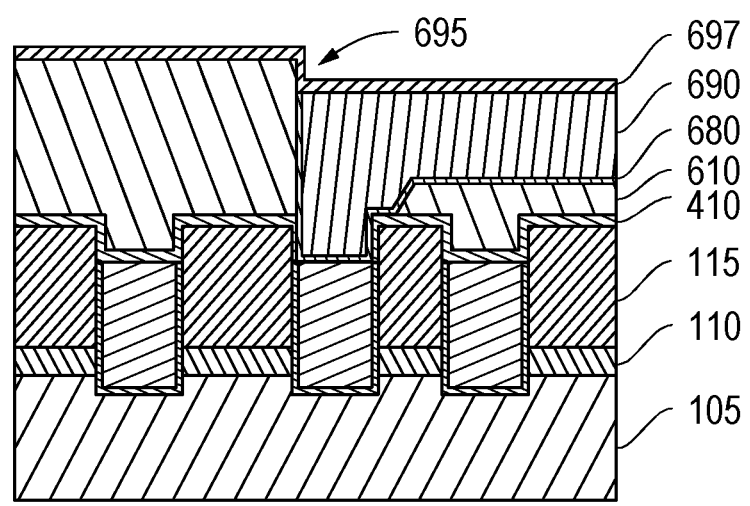

As mentioned above, after the processing as shown in FIG. 4 or FIG. 5B, additional FSAV process steps may be performed as known in the art. Exemplary additional FSAV process steps are shown in FIGS. 6A-6G. It will be recognized, however, that many other additional FSAV process steps may be utilized, as the techniques described herein are merely exemplary. As shown in FIG. 6A, additional processing steps after the formation of the etch stop layer 410 as shown in FIG. 5B are shown. As shown in FIG. 6A, an upper low-k layer 610, upper hard mask layer(s) 620 and a metal hard mask layer 630 are provided. Next, as shown in FIG. 6B, a first upper photoresist layer 640 is patterned as shown. The pattern of the first upper photoresist layer 640 may correspond to an upper trench. Then, as shown in FIG. 6C, the metal hard mask layer 630 may be etched and the first upper photoresist layer 640 removed. As shown in FIG. 6D, a second upper photoresist layer 650 may be patterned. The pattern of the second upper photoresist layer 650 may correspond to a via pattern. Next, a via 660 may be etched and the upper photoresist layer 650 removed as shown in FIG. 6E. Next, using the metal hard mask 630 as a mask, the upper low-k layer 610 may be etched as shown in FIG. 6F to form an upper trench 670. Next, an upper barrier or liner layer 680 may be provided and an upper conductor layer 690 also provided. The upper conductor layer 690 may then be planarized. Then, if desired, the upper conductor layer 690 may be recessed to form upper recess 695 utilizing the process described above with respect to FIGS. 2-5B to form recesses without damaging a low-k dielectric layer. Finally an upper etch stop layer 697 may be provided. FIG. 6G provides the final structure illustrating the upper barrier or liner layer 680, the upper conductor layer 690, the upper recess 695 and the upper etch stop layer 697.

As described above, a SAM process may be utilized as part of the selective formation of the protection layer. It will be recognized, however, that other selective formation processes may be utilized and the techniques disclosed herein are not limited to a particular selective formation process.

The various compositions of the layers and materials described herein are merely exemplary and not meant to be limiting. For example, ruthenium metal layers or copper metal layers may be utilized for the conductor layer. However, other conductor materials may be utilized including cobalt and tungsten. Further, the low-k layer may be any of a wide variety of types of low-k materials, including in one example low-k dielectric layers. Such low-k dielectric layers may comprise doped silicon dioxide, porous silicon dioxide, polymer based dielectrics, organic dielectrics, etc. The selective formed protection layer may be any of a wide variety of films. For example, the protection layer may be comprised of (or a combination of) silicon dioxide, silicon nitride, silicon oxynitride, silicon carbide, silicon carbon nitride, silicon oxycarbide, organosilicate glass, carbon doped oxide dielectrics comprised of silicon, carbon, oxygen and hydrogen, etc. If the protection layer is a layer that will be removed, then the protection layer may be formed of (in addition to those materials mentioned above) conductive materials. Such conductive materials used for the protection layer may include, but are not limited to tantalum, titanium nitride, tungsten, zirconium, etc.

In one exemplary embodiment, the selectively formed protection layer may have a thickness of 5 nm or less. As mentioned above, for embodiments in which the protection layer is removed, the material chosen for the protection layer and the etch utilized to remove the protection layer may be selected such that suppression of the damage on the low-k layer by the removal process is achieved. It will be noted that some low-k damage may occur by other mechanisms. For example, if the etch stop layer is deposited by a plasma chemical vapor deposition (CVD) process, the plasma of the CVD process may cause some low-k damage.

It will be recognized that the process flows described above are merely exemplary, and many other processes and applications may advantageously utilize the techniques disclosed herein. Thus, though advantageous for use in a FSAV process, the techniques described herein may be utilized in other process flows. Further, as described herein, general substrate processing techniques are provided. In one embodiment, the techniques may be utilized in semiconductor substrate processing, and more particular, semiconductor wafer processing.

Figure 7:
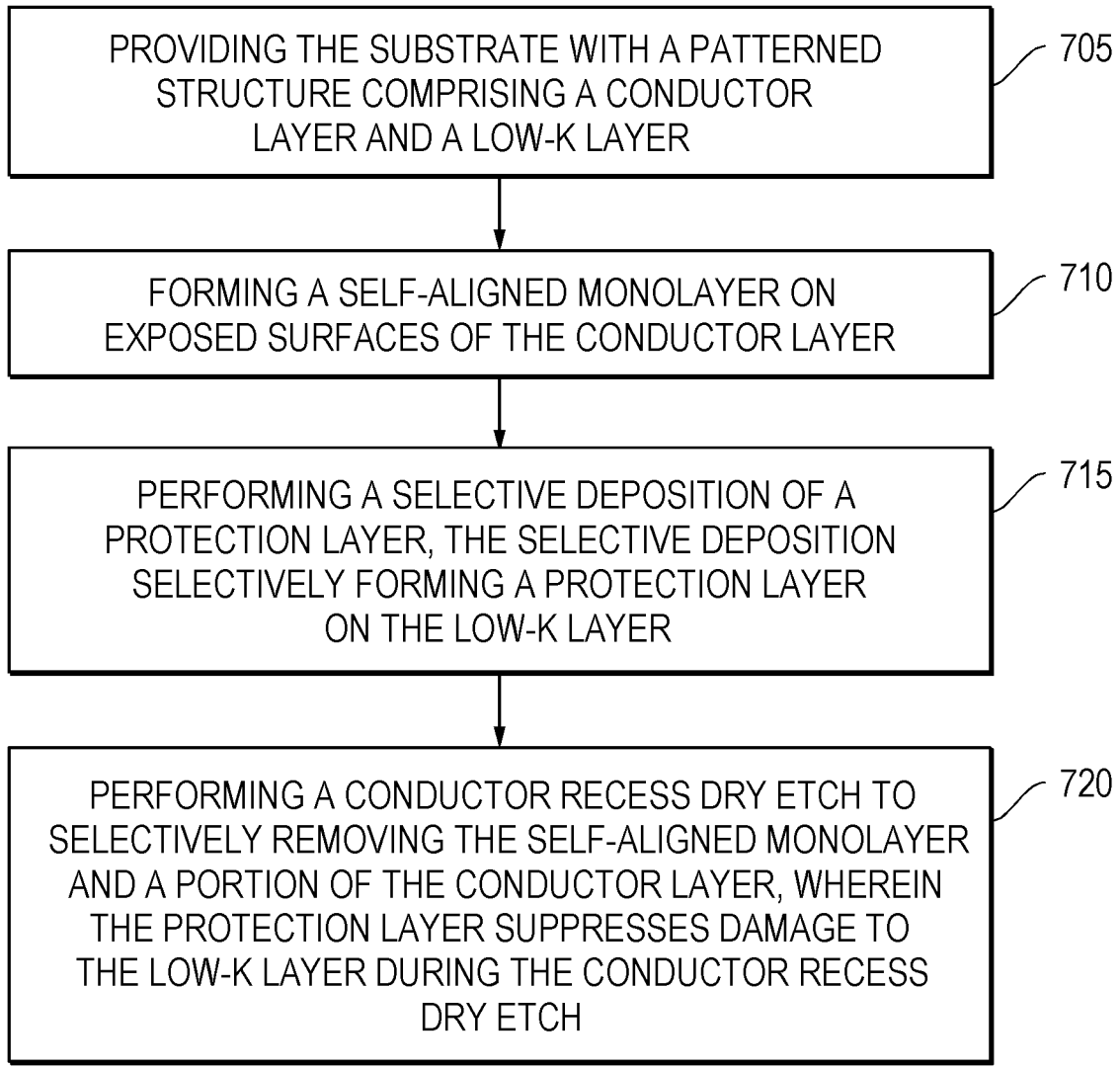
FIGS. 7-9 illustrate exemplary methods for using the techniques disclosed herein.
Figure 8:
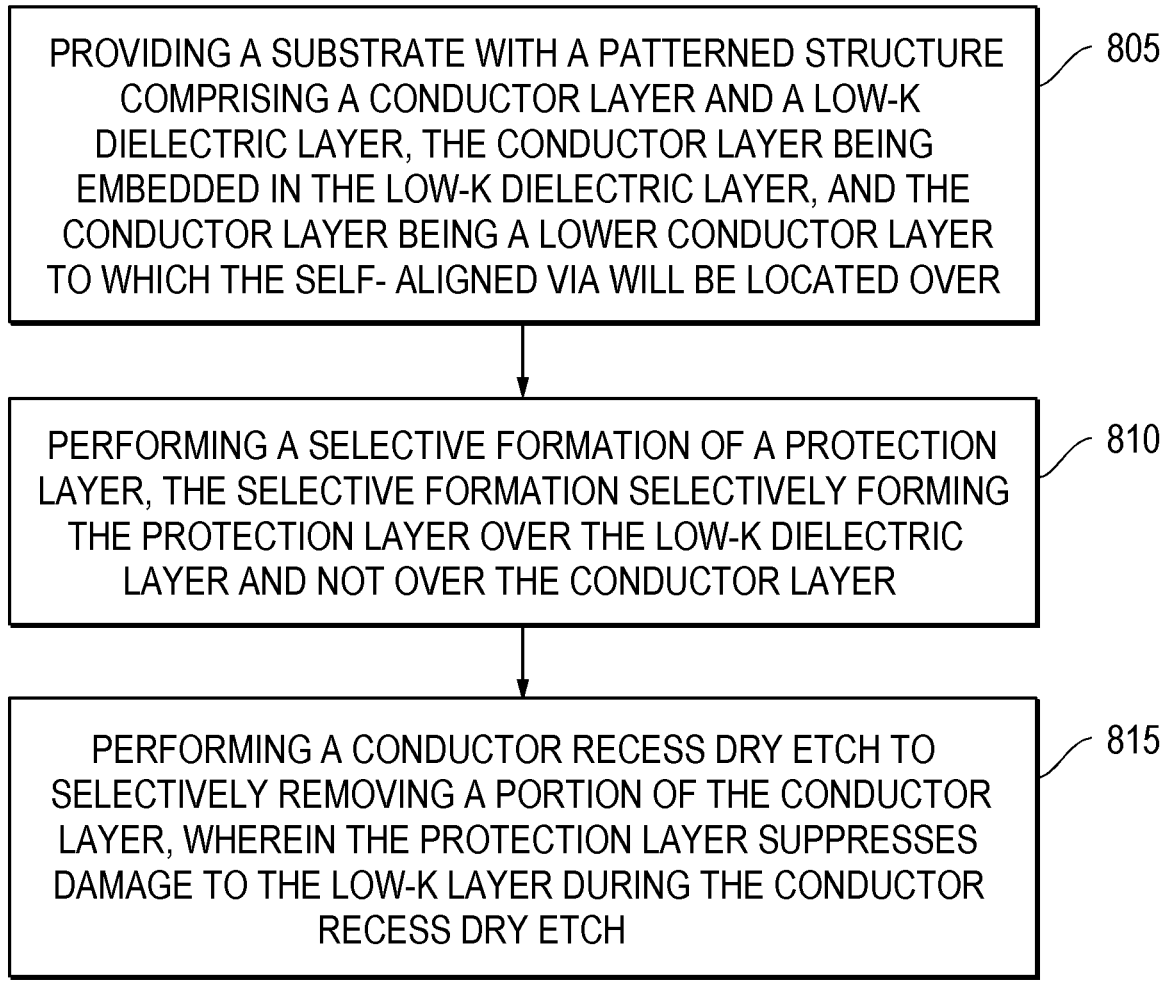
Figure 9:
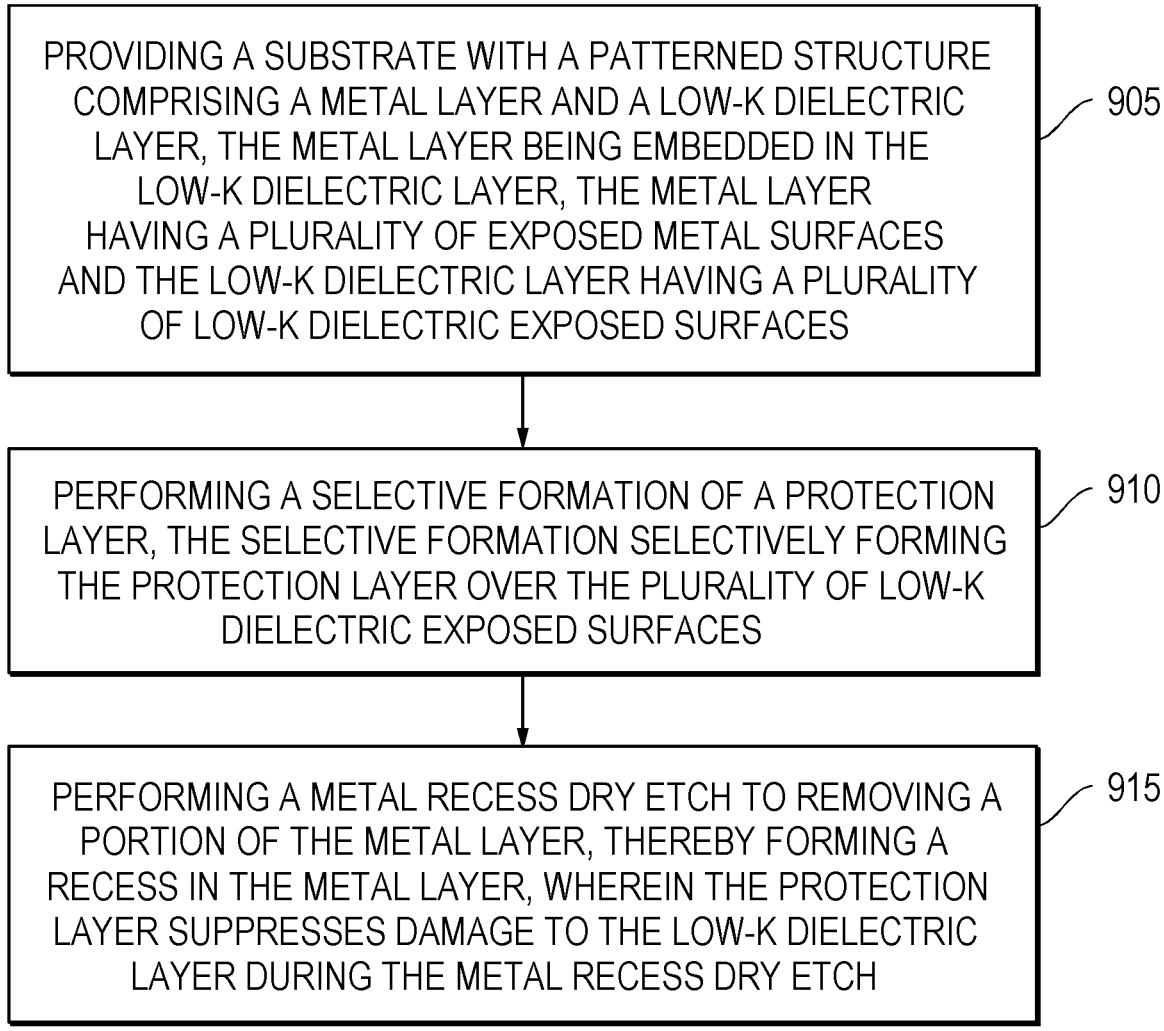

FIGS. 7-9 illustrate exemplary methods for use of the processing techniques described herein. It will be recognized that the embodiments of FIGS. 7-9 are merely exemplary and additional methods may utilize the techniques described herein. Further, additional processing steps may be added to the methods shown in the FIGS. 7-9 as the steps described are not intended to be exclusive. Moreover, the order of the steps is not limited to the order shown in the figures as different orders may occur and/or various steps may be performed in combination or at the same time.

In FIG. 7, a method for processing a substrate is illustrated. The method comprises step 705 of providing the substrate with a patterned structure comprising a conductor layer and a low-k layer and step 710 of forming a self-aligned monolayer on exposed surfaces of the conductor layer. The method further comprises step 715 of performing a selective deposition of a protection layer, the selective deposition selectively forming a protection layer on the low-k layer. The method also comprises step 720 of performing a conductor recess dry etch to selectively removing the self-aligned monolayer and a portion of the conductor layer, wherein the protection layer suppresses damage to the low-k layer during the conductor recess dry etch.

In FIG. 8, a method utilized in forming a self-aligned via is illustrated. The method comprises step 805 of providing a substrate with a patterned structure comprising a conductor layer and a low-k dielectric layer, the conductor layer being embedded in the low-k dielectric layer, and the conductor layer being a lower conductor layer to which the self-aligned via will be located over. The method also comprises step 810 of performing a selective formation of a protection layer, the selective formation selectively forming the protection layer over the low-k dielectric layer and not over the conductor layer. The method further comprises step 815 of performing a conductor recess dry etch to selectively removing a portion of the conductor layer, wherein the protection layer suppresses damage to the low-k layer during the conductor recess dry etch.

In FIG. 9, a method utilized in forming a recess in a metal layer is illustrated. The method comprises step 905 of providing a substrate with a patterned structure comprising a metal layer and a low-k dielectric layer, the metal layer being embedded in the low-k dielectric layer, the metal layer having a plurality of exposed metal surfaces and the low-k dielectric layer having a plurality of low-k dielectric exposed surfaces. The method also comprises step 910 of performing a selective formation of a protection layer, the selective formation selectively forming the protection layer over the plurality of low-k dielectric exposed surfaces. The method further comprises step 915 of performing a metal recess dry etch to removing a portion of the metal layer, thereby forming a recess in the metal layer, wherein the protection layer suppresses damage to the low-k dielectric layer during the metal recess dry etch.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method for processing a substrate, the method comprising:
   providing the substrate with a patterned structure comprising a conductor layer and a low-k layer;
   forming a self-aligned monolayer on exposed surfaces of the conductor layer;
   performing a selective deposition of a protection layer, the selective deposition selectively forming a protection layer on the low-k layer; and
   performing a conductor recess dry etch to selectively remove the self-aligned monolayer and a portion of the conductor layer, wherein the protection layer suppresses damage to the low-k layer during the conductor recess dry etch.

2. The method of claim 1, further comprising:
   providing a barrier or liner layer between the conductor layer and the low-k layer, wherein the conductor recess dry etch selectively etches the conductor layer to the barrier or liner layer so that the barrier or liner layer suppresses damage to sidewalls of the low-k layer during the conductor recess dry etch.

3. The method of claim 1, further comprising:
providing a barrier or liner layer between the conductor layer and the low-k layer; and
performing, after the conductor recess dry etch, a barrier or liner layer removal process to remove an exposed portion of the barrier or liner layer.

4. The method of claim 3, further comprising:
forming an etch stop layer on the substrate after performing the conductor recess dry etch, wherein the protection layer is on the substrate during the forming of the etch stop layer.

5. The method of claim 3, further comprising:
forming an etch stop layer on the substrate after performing the conductor recess dry etch, wherein the protection layer is removed from the substrate before the forming of the etch stop layer.

6. The method of claim 1, further comprising:
forming an etch stop layer on the substrate after performing the conductor recess dry etch, wherein the protection layer is on the substrate during the forming of the etch stop layer.

7. The method of claim 1, further comprising:
forming an etch stop layer on the substrate after performing the conductor recess dry etch, wherein the protection layer is removed from the substrate before the forming of the etch stop layer.

8. The method of claim 1, wherein suppression of damage to the low-k layer suppresses increases in a dielectric constant of the low-k layer.

9. A method utilized in forming a self-aligned via, the method comprising:
providing a substrate with a patterned structure comprising a conductor layer and a low-k dielectric layer, the conductor layer being embedded in the low-k dielectric layer, and the conductor layer being a lower conductor layer to which the self-aligned via will be located over;
performing a selective formation of a protection layer, the selective formation selectively forming the protection layer over the low-k dielectric layer and not over the conductor layer; and
performing a conductor recess dry etch to selectively remove a portion of the conductor layer, wherein the protection layer suppresses damage to the low-k dielectric layer during the conductor recess dry etch.

10. The method of claim 9, further comprising forming a self-aligned monolayer on exposed surfaces of the conductor layer before the selective formation of the protection layer.

11. The method of claim 9, further comprising:
forming an etch stop layer on the substrate after performing the conductor recess dry etch, wherein the protection layer is on the substrate during the forming of the etch stop layer.

12. The method of claim 9, further comprising:
forming an etch stop layer on the substrate after performing the conductor recess dry etch, wherein the protection layer is removed from the substrate before the forming of the etch stop layer.

13. The method of claim 9, further comprising, after the conductor recess dry etch, leaving the protection layer on the substrate during one or more additional self-aligned via process steps.

14. The method of claim 9, further comprising removing the protection layer after the conductor recess dry etch.

15. The method of claim 9, wherein suppression of damage to the low-k dielectric layer suppresses increases in a dielectric constant of the low-k dielectric layer.

16. A method utilized in forming a recess in a metal layer, the method comprising:
providing a substrate with a patterned structure comprising a metal layer and a low-k dielectric layer, the metal layer being embedded in the low-k dielectric layer, the metal layer having a plurality of exposed metal surfaces and the low-k dielectric layer having a plurality of low-k dielectric exposed surfaces;
performing a selective formation of a protection layer, the selective formation selectively forming the protection layer over the plurality of low-k dielectric exposed surfaces; and
performing a metal recess dry etch to remove a portion of the metal layer, thereby forming a recess in the metal layer, wherein the protection layer suppresses damage to the low-k dielectric layer during the metal recess dry etch.

17. The method of claim 16, wherein the metal layer comprises ruthenium and the metal recess dry etch comprises an oxygen containing plasma.

18. The method of claim 16, further comprising forming a self-aligned monolayer on the plurality of exposed metal surfaces before the selective formation of the protection layer.

19. The method of claim 16, further comprising removing the protection layer after performing the metal recess dry etch.

20. The method of claim 16, further comprising leaving the protection layer on the substrate during one or more additional process steps performed after the recess is formed.

* * * * *